United States Patent
Winkler et al.

(10) Patent No.: US 9,939,731 B2
(45) Date of Patent: Apr. 10, 2018

(54) ILLUMINATION OPTICS FOR EUV PROJECTION LITHOGRAPHY

(71) Applicant: Carl Zeiss SMT GmbH, Oberkochen (DE)

(72) Inventors: Alexander Winkler, Aalen (DE); Daniel Lenz, Aalen (DE); Thomas Fischer, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/672,906

(22) Filed: Aug. 9, 2017

(65) Prior Publication Data

US 2017/0336719 A1 Nov. 23, 2017

Related U.S. Application Data

(63) Continuation of application No. PCT/EP2016/052168, filed on Feb. 2, 2016.

(30) Foreign Application Priority Data

Feb. 11, 2015 (DE) .................. 10 2015 202 411
May 8, 2015 (DE) .................. 10 2015 208 571

(51) Int. Cl.
   *G03F 7/20* (2006.01)
   *G02B 19/00* (2006.01)
   (Continued)

(52) U.S. Cl.
   CPC ..... *G03F 7/70166* (2013.01); *G02B 19/0023* (2013.01); *G02B 26/0833* (2013.01);
   (Continued)

(58) Field of Classification Search
   CPC ............ G03F 7/70166; G03F 7/70108; G03F 7/70775; G03F 7/70991
   (Continued)

(56) References Cited

U.S. PATENT DOCUMENTS 6,438,199 B1   8/2002  Schutlz et al.
6,658,084 B2  12/2003  Singer
(Continued)

FOREIGN PATENT DOCUMENTS

DE   10 2006 036 064 A1   2/2008
DE   10 2007 047 446 A1   4/2009
(Continued)

OTHER PUBLICATIONS

German Examination Report, with translations thereof, for corresponding Appl No. 10 2015 202 411.3, dated Sep. 8, 2015.
(Continued)

*Primary Examiner* — Hung Henry Nguyen
(74) *Attorney, Agent, or Firm* — Fish & Richardson P.C.

(57) ABSTRACT

An illumination optical unit for EUV projection lithography includes a field facet mirror and a pupil facet mirror. A correction control device, which is used for the controlled displacement of at least some field facets that are usable as correction field facets, which are signal connected to displacement actuators, is embodied so that a correction displacement path for the correction field facets is so large that a respective correction illumination channel is cut off at the margin by the correction pupil facet so that the illumination light partial beam is not transferred in the entirety thereof from the correction pupil facet into the object field.

20 Claims, 8 Drawing Sheets

(51) Int. Cl.
*G02B 26/08* (2006.01)
*G21K 1/06* (2006.01)

(52) U.S. Cl.
CPC .......... *G03F 7/702* (2013.01); *G03F 7/70108* (2013.01); *G21K 1/067* (2013.01)

(58) Field of Classification Search
USPC .................................. 355/52, 53, 55, 67–71
See application file for complete search history.

(56) References Cited

U.S. PATENT DOCUMENTS

| | | | |
|---|---|---|---|
| 6,859,515 B2 | 2/2005 | Schutlz et al. | |
| 2008/0278704 A1 | 11/2008 | Endres et al. | |
| 2010/0231877 A1 | 9/2010 | Wolschrijn et al. | |
| 2011/0001947 A1* | 1/2011 | Dinger | G02B 26/06 355/67 |
| 2011/0063598 A1 | 3/2011 | Fiolka et al. | |
| 2014/0362361 A1* | 12/2014 | Patra | G02B 26/0833 355/67 |
| 2016/0313649 A1* | 10/2016 | Hol | G03F 7/70758 |

FOREIGN PATENT DOCUMENTS

| | | |
|---|---|---|
| DE | 10 2008 001 511 A1 | 11/2009 |
| DE | 10 2012 210 073 A1 | 4/2013 |
| EP | 1 225 481 A | 7/2002 |
| WO | WO 2009/024 164 A1 | 2/2009 |
| WO | WO 2009/100 856 A1 | 8/2009 |
| WO | WO 2009/132 756 A1 | 11/2009 |

OTHER PUBLICATIONS

German Examination Report with translations thereof, for corresponding Appl No. 10 2015 208 571.6, dated Dec. 14, 2015 571.
International Search Report for corresponding Appl No. PCT/EP2016/052168, dated Jun. 30, 2016.

* cited by examiner

ILLUMINATION OPTICS FOR EUV PROJECTION LITHOGRAPHY

CROSS-REFERENCE TO RELATED APPLICATIONS

The present application is a continuation of, and claims benefit under 35 USC 120 to, international application PCT/EP2016/052168, filed Feb. 2, 2016, which claims benefit under 35 USC 119 of German Application Nos. 10 2015 202 411.3, filed Feb. 11, 2015 and 10 2015 208 571.6, filed May 8, 2015. The entire disclosure of these applications are incorporated by reference herein.

FIELD

The disclosure relates to an illumination optical unit for EUV projection lithography for illuminating an object field, in which an object to be imaged is arrangeable, with illumination light. Furthermore, the disclosure relates to an illumination system including such an illumination optical unit, an optical system including such an illumination optical unit, and a projection exposure apparatus including such an optical system. Furthermore, the disclosure relates to a method for prescribing an intended distribution of an illumination light intensity over a field height of an object field of a projection exposure apparatus. Furthermore, the disclosure relates to a method for prescribing a minimum illumination intensity of illumination light over a transverse field coordinate of an object field of an illumination optical unit for projection lithography. Furthermore, the disclosure relates to a method for producing a microstructured or nanostructured component using such a projection exposure apparatus, and a microstructured or nanostructured component produced using such a method.

BACKGROUND

An illumination optical unit of the type set forth at the outset is known from DE 10 2008 001 511 A1, DE 10 2007 047 446 A1, US 2011/0001947 A1, WO 2009/132 756 A1, WO 2009/100 856 A1, and also U.S. Pat. Nos. 6,438,199 B1 and 6,658,084 B2.

SUMMARY

The disclosure seeks to develop an illumination optical unit so that a flexible field-dependent correction of illumination parameters is ensured.

In one aspect, the disclosure provides an illumination optical unit for EUV projection lithography for illuminating an object field, in which an object to be imaged is arrangeable. The unit includes a field facet mirror with a plurality of field facets, arranged in the region of a field plane of the illumination optical unit. The unit also includes a pupil facet mirror with a plurality of pupil facets, arranged in the region of a pupil plane of the illumination optical unit. Each of the field facets serves to transfer used illumination light from a light source to respectively one of the pupil facets. Via respectively one illumination channel, a respective used illumination light partial beam is guided between the light source and the object field via exactly one field facet and exactly one pupil facet. A transfer optical unit that is disposed downstream of the field facet in the respective illumination channel is embodied for superposed imaging of the field facets into the object field. For each illumination channel, the transfer optical unit respectively includes one of the pupil facets for transferring the illumination light partial beam from the field facet toward the object field. At least some pupil facets, which are usable as correction pupil facets, are arranged in the beam path of the illumination light partial beam impinging thereon in such a way that an image of the light source arises at an image location which lies at a distance from the pupil facet along the illumination channel. The unit further includes a correction control device for the controlled displacement of at least some of the field facets, which are assigned to the correction pupil facets via the respective illumination channels and which are usable as correction field facets, via correction actuators that are connected to the correction field facets. The correction control device and the correction actuators are embodied in such a way that a correction displacement travel of the correction field facets in a correction displacement range is so large that a respective correction illumination channel is cut off by an edge of the correction pupil facet in such a way that the illumination light partial beam is not transferred in the entirety thereof from the correction pupil facet into the object field.

According to the disclosure, it was recognized that introducing a targeted distance between a light source image and the pupil facets that are impinged upon by the illumination light leads to a field-dependent spatial distribution of an illumination light impingement on the pupil facets which can be used for illumination parameter correction purposes. The distance between the correction pupil facets and the light source image leads to a light spot of the illumination light partial beam that impinges on the correction pupil facets arising on the correction pupil facets, the light spot representing a convolution of a field facet edge or marginal contour with a source marginal contour of the light source. Trimming the illumination light partial beam within the scope of the correction leads to illumination light being transferred from this correction pupil facet toward the object field with different intensities, depending on the location on the object field. A field-dependent correction of an illumination angle distribution over the object field can be obtained by a controlled displacement of the correction field facets. All field facets of the field facet mirror can represent correction field facets. All pupil facets of the pupil facet mirror can represent correction pupil facets.

The controlled displacement, which may be caused by way of the correction control device, may be a controlled tilt. Accordingly, the correction actuators can be correction tilt actuators. The correction displacement travel can be a correction tilt angle of the correction field facets, which is so large in a correction tilt angle range that a respective correction illumination channel is trimmed by an edge or margin of the correction pupil facet in such a way that the illumination light partial beam is not transferred in the entirety thereof from the correction pupil facet into the object field. In addition to a tilt, the displacement can also be a translation or else the targeted establishment of a defocus.

For the purposes of flexibly prescribing illumination settings, the number of pupil facets may be greater than the number of field facets, wherein there may be a change between different pupil facets that are impinged upon by the field facets by way of an actuation of appropriate tilt actuators and a corresponding tilt of these field facets. Despite this possibility for change, each of the field facets transfers illumination light from the light source to, in each case, exactly one of the pupil facets in a specific, set illumination geometry.

Accordingly, via respectively one illumination channel, a respective illumination light partial beam is guided in this illumination situation between the light source and the object field via exactly one field facet and exactly one pupil facet. The change-tilt actuators that bring about the change between various pupil facets that can be impinged upon via a respective field facet can be actuators that are independent of the correction actuators. Alternatively, it is possible for the change-tilt actuators to be designed in such a way that they meet both functions of "changing illumination setting" and "correcting illumination parameters".

The field facet mirror need not be arranged precisely in the field plane. It is sufficient for the field facet mirror to be arranged in a near-field manner. The pupil facet mirror need not be arranged precisely in a pupil plane. It is sufficient for the pupil facet mirror to be arranged in a near-pupil manner.

For the purposes of characterizing these terms of "near-field" and "near-pupil", use can be made of the following parameter P, which is likewise explained in WO 2009/024 164 A:

$$P(M)=D(SA)/(D(SA)+D(CR))$$

Here:

D(SA) is the diameter of a sub-aperture, i.e. a partial beam, of the used illumination light, which emanates from exactly one field point, on a beam-forming surface of the component M, i.e., for example, of the field facet mirror or of the pupil facet mirror;

D(CR) is the maximum spacing of chief rays of an effective object field that is imaged by the lens, measured in a reference plane (e.g. in a plane of symmetry or a meridional plane), on the beam forming surface of M;

in a field plane, the following applies: P=0, since D(CR) is unequal to 0 and D(SA)=0;

in a pupil plane, the following applies: P=1, since D(CR)=0 and D(SA) is unequal to 0.

"Near-pupil" means: P is at least 0.7, e.g. 0.75, at least 0.8, e.g. 0.85, or at least 0.9, e.g. 0.95.

"Near-field" means: P is at most 0.3, e.g. 0.25, at most 0.2, e.g. 0.15, or at most 0.1, e.g. 0.05.

The parameter P can also be used to characterize the distance between the image location of the image of the light source and the respective correction pupil facet along the illumination channel. For the purposes of this characterization, the image location of the light source image is defined as prescribing the positioning of the pupil plane. Then, the respective correction pupil facet lies in a near-pupil manner in relation to this image location, but not exactly in the pupil plane. Thus, 0.5<P<1 applies. Here, in particular, P is at least 0.7, e.g. 0.75, at least 0.8, e.g. 0.85, or at least 0.9, e.g. 0.95. P can be less than 0.995, less than 0.99 or else less than 0.98.

In the case of specific illumination geometries, illumination light may also be transferred to a plurality of pupil facets at the same time via exactly one field facet. However, used illumination light is transferred exactly to one pupil facet in the process. The illumination light possibly still impinging on other pupil facets is not used illumination light and not transferred toward the illumination field by these other pupil facets; instead, it is either used for other purposes or disposed of in a controlled manner.

Some or all of the field facets and/or of the pupil facets may, in turn, be constructed from a plurality of individual small mirrors. In particular, the field facet mirror and/or the pupil facet mirror can be constructed as a MEMS (microelectromechanical mirror) array, wherein each of the field facets and each of the pupil facets may then be constructed from a multiplicity of small MEMS mirrors. An example of such a MEMS structure is supplied by WO 2009/100 856 A1.

In the case of such a MEMS embodiment, a targeted defocus may be brought about as an option for the correction displacement, which is to be produced, by prescribing a change in a curvature angle of the respective field facet.

The transfer optical unit that is disposed downstream in the respective illumination channel of the field facets can be formed exclusively by the respective downstream pupil facet lying within the illumination channel. Alternatively, the transfer optical unit may also still include further components, in particular further mirrors, which are still disposed downstream of the pupil facet of a respective illumination channel and disposed upstream of the object field.

The correction actuators can be embodied for the continuous dis-placement of the correction field facets. Such displacement actuators facilitate fine influencing of illumination parameters to be corrected. Alternatively, it is possible to design the displacement actuators in such a way that a plurality of discrete tilt states of the correction field facets can be achieved. By way of example, such a design of the displacement actuators can ensure reliably reproducible displacement positions. A continuous displacement of the correction field facets leads to a continuous prescription of a displacement path.

The correction actuators can be embodied to displace the correction field facets about two mutually perpendicular axes. Such correction actuators facilitate particularly flexible correction displacements of the correction field facets.

The object can be displaceable along an object displacement direction, wherein an arrangement geometry of guiding the illumination light via the illumination channels is such that a cross section of the respective illumination channel on the correction pupil facets has a marginal contour in such a way that, over a variable of the correction displacement path, it is possible to prescribe a marginal trimming or cut off of the cross section in a direction (+/−x) perpendicular to the object displacement direction. Such a configuration of the illumination optical unit facilitates a flexible illumination correction, via which it is possible to influence different field dependencies and/or influence different, field-dependent illumination parameters.

The object can be displaceable along an object displacement direction, wherein an arrangement geometry of guiding the illumination light via the illumination channels is such that a cross section of the respective illumination channel on the correction pupil facets has a marginal contour in such a way that, over a variable of the correction displacement path, it is possible to prescribe a marginal trimming or cut off of the cross section in a direction parallel to the object displacement direction. Such a configuration of the illumination optical unit facilitates a flexible illumination correction, via which it is possible to influence different field dependencies and/or influence different, field-dependent illumination parameters.

By way of a direction of the correction displacement path, it is possible to prescribe whether trimming of the cross section of the illumination channel is carried out centrally or marginally when seen in a dimension perpendicular to a trimmed or cut off edge or margin. Such a configuration of the illumination optical unit facilitates a flexible illumination correction, via which it is possible to influence different field dependencies and/or influence different, field-dependent illumination parameters.

By using arcuate field facets, it is possible to obtain a corresponding arcuate light spot of the illumination light partial beam, which arises by way of the convolution with the source structure, on the correction pupil facets, the edge or marginal contour of which is particularly suitable for a trim correction since, depending on the displacement direction of the light spot, this results in trimming at the edge or margin of the correction pupil facet which leads to a different field-dependent illumination parameter correction effect. Alternatively, the field facets may also have a straight, i.e. not arcuate, and e.g. rectangular embodiment.

The advantages of an illumination system including such an illumination optical unit and a light source for producing the illumination light, of an optical system including such an illumination optical unit and a projection optical unit for imaging the object field into an image field, of a projection exposure apparatus including such an illumination optical unit, of an illumination light intensity prescription method using such an illumination optical unit, of a production method using such an illumination optical unit, and of a microstructured or nanostructured component made by such a method correspond to those which have already been explained above with reference to the illumination optical unit according to the disclosure.

The disclosure also seeks to specify a method for prescribing a minimum illumination intensity of illumination light over a transverse field coordinate of an object field of an illumination optical unit for projection lithography, which can be used for increasing the illumination light throughput during the projection exposure.

In one aspect, the disclosure provides a method for prescribing a minimum illumination intensity of illumination light over a transverse field coordinate of an object field of an illumination optical unit for projection lithography, wherein an object to be imaged is arrangeable in the object field, wherein the transverse field coordinate extends transversely to an object displacement direction, along which the object is displaceable, wherein the illumination optical unit includes two facet mirrors that are arranged in succession in the beam path of the illumination light in such a way that, via respectively one illumination channel, a respective used illumination light partial beam is guided between a light source and the object field via exactly one facet of the first facet mirror and exactly one facet of the second facet mirror. The method includes: identifying a minimum intensity transverse field coordinate, at which the overall illumination intensity of the illumination light partial beams that are guided via all illumination channels is minimal; identifying at least one illumination channel, in which a variation of a marginal trimming or cut off of the illumination light partial beam, which is guided thereover, at the second facet leads to an increase in an illumination intensity of this illumination light partial beam at the minimum intensity transverse field coordinate; aligning the first facet of this illumination channel for increasing the inllumination intensity thereof at the minimum intensity transverse field coordinate.

According to the disclosure, it was recognized that by increasing the illumination intensity of the illumination channel, which is respectively identified in this case, at the minimum intensity transverse field coordinate, it is possible to raise the minimum overall illumination intensity which is present at the minimum intensity transverse field coordinate. This results in less illumination light remaining unused by shadowing, for example by using a field intensity prescription device in the style of a UNICOM, if the same illumination intensity should be present over all transverse field coordinates. This results in a higher illumination light throughput. The prescription method starts at the global intensity minimum, which emerges from the superposition of the illumination intensities of all illumination light partial beams over the transverse field coordinate. The two facets mirrors can be a field facet mirror and a pupil facet mirror.

The illumination channels, which can be used for alignment when the prescription method is used, may be illumination channels with correction facets of the illumination optical unit according to the disclosure. During the prescription method according to the disclosure, it is possible to identify a plurality of illumination channels and the first facets thereof may be aligned accordingly. It is also possible to accordingly identify and align all illumination channels. To the extent that individual illumination channels are identifeed by a measurement, the individual illumination channels can be identified e.g. by shadowing all other illumination channels and measuring, across the transverse field coordinate, the intensity of an illumination light intensity which is guided to the object field via the remaining illumination channel. This can be carried out using a spatially resolved sensor.

The method can further include: identifying at least one illumination channel, in which a variation of a marginal trimming or cut off of the illumination light partial beam, which is guided thereover, at the second facet leads to an increase in a minimum illumination intensity of this illumination light partial beam over the trans-verse field coordinate; and aligning the first facet of this illumination channel for increasing this minimum illumination intensity. In such a case, a minimum illumination intensity in each individual illumination channel can be increased across the transverse field coordinate where this is possible by way of an appropriate trimming variation. The transverse field coordinate of an appropriate individual illumination channel minimum need not be the minimum intensity transverse field coordinate. It is also possible to identify and align a plurality of illumination channels. In the extreme case, it is possible to identify and align all illumination channels.

When prescribing the minimum illumination intensity of the illumination light over the object field transverse field coordinate, it is possible to dynamically tilt the first facet for alignment purposes. In this method, use can be made of an actuator that displaces the facet, in particular the correction actuator. Alternatively, the first facet can also be aligned statically in the basic set-up of the field facet mirror.

When adjusting the actual illumination setting within the scope of the production method, use can be made of a field-dependent individual channel intensity correction. The field-dependent individual channel intensity correction may contain the following sequence of method steps:

1. Determining an illumination light partial beam of at least one illumination channel selected for correction purposes, by measurement and/or by calculation. During the measurement, the illumination light partial beam can be measured in a prescribed correction plane, for example by the use of a spatially resolved intensity detector. A calculation of the illumination light partial beam can be effectuated by computational determination of a point spread function, for example with the aid of an optical design program. This calculation can be carried out analytically or numerically, or else by way of a simulation.
2. Determining a correction information item, in particular a set of actuator positions of the correction actuators of the correction field facets. In particular, the correction information item can be a set of tilt angles of the correction field facets. Determining this correction information item can be effectuated by a numerical computational method and/or by an analytical computational method.
3. Using the correction information item for the correction displacement of the correction field facets. This can be carried out by actuating the correction actuators.

4. Verifying the effect of the correction information item as an optional step. This verification can be effectuated by a measurement and/or by a simulation.

Within the scope of the field-dependent individual channel intensity correction, the method mentioned above can be used for prescribing an intended distribution of an illumination light intensity over the field height of the object field of the projection exposure apparatus.

The component can be produced with an extremely high structural resolution. In this way it is possible, for example, to produce a semiconductor chip having an extremely high integration or storage density.

BRIEF DESCRIPTION OF THE DRAWINGS

Exemplary embodiments of the disclosure are explained in more detail below on the basis of the drawing. In the drawings:

FIG. 7)

DESCRIPTION OF EXEMPLARY EMBODIMENTS

Figure 1:
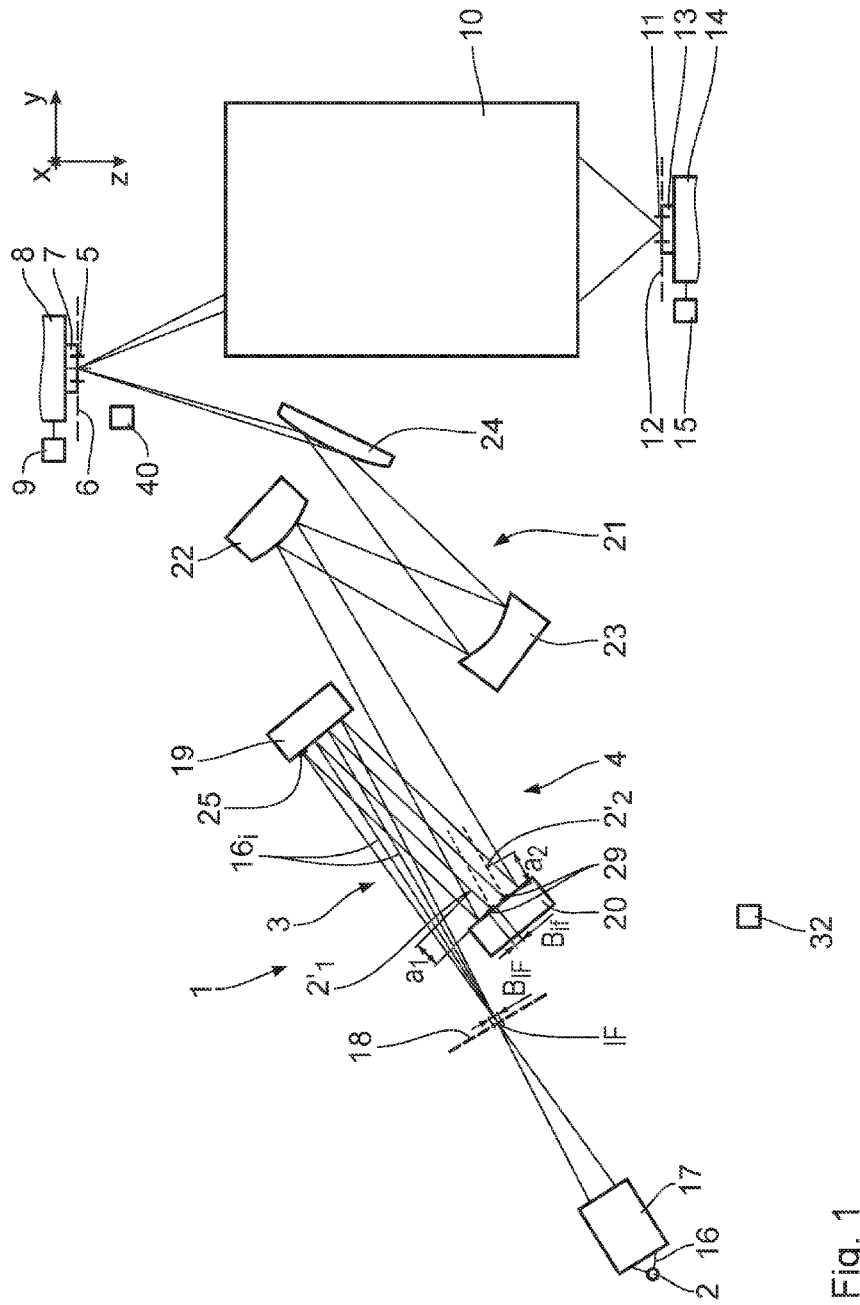
FIG. 1 schematically shows a meridional section through a projection exposure apparatus for EUV projection lithography.

FIG. 1 schematically shows a microlithographic projection exposure apparatus 1 in a meridional section. The projection exposure apparatus 1 includes a light or radiation source 2. An illumination system 3 of the projection exposure apparatus 1 has an illumination optical unit 4 for exposing an illumination field coinciding with an object field 5 in an object plane 6. The illumination field may also be larger than the object field 5. In this case, an object in the form of a reticle 7 arranged in the object field 5, the reticle being held by an object or reticle holder 8, is exposed. The reticle 7 is also referred to as lithography mask. The object holder 8 is displaceable along an object displacement direction via an object displacement drive 9. A projection optical unit 10 serves for imaging the object field 5 into an image field 11 in an image plane 12. A structure on the reticle 7 is imaged onto a light-sensitive layer of a wafer 13 arranged in the region of the image field 11 in the image plane 12. The wafer 13 is held by a wafer holder 14. By way of a wafer displacement drive 15, the wafer holder 14 is displaceable parallel to the object displacement direction in a manner synchronized with the object holder 8.

The radiation source 2 is an EUV radiation source having an emitted used radiation in the range of between 5 nm and 30 nm. This may be a plasma source, for example a GDPP (gas discharge-produced plasma) source or an LPP (laser-produced plasma) source. A radiation source based on a synchrotron or on a free electron laser (FEL) may also be used for the radiation source 2. Information about such a radiation source is able to be found by the person skilled in the art for example from U.S. Pat. No. 6,859,515 B2. EUV radiation 16, which emanates from the radiation source 2, in particular the used illumination light that illuminates the object field 5, is focused by a collector 17. A corresponding collector is known from EP 1 225 481 A. Downstream of the collector 17, the EUV radiation 16 propagates through an intermediate focal plane 18 before being incident on a field facet mirror 19. The field facet mirror 19 is a first facet mirror of the illumination optical unit 4. The field facet mirror 19 includes a plurality of reflecting field facets which are not depicted in FIG. 1. The field facet mirror 19 is arranged in a field plane of the illumination optical unit 4 which is optically conjugate with respect to the object plane 6.

The EUV radiation 16 is also referred to hereinafter as illumination light or as imaging light.

Downstream of the field facet mirror 19, the EUV radiation 16 is reflected by a pupil facet mirror 20. The pupil facet mirror 20 is a second facet mirror of the illumination optical unit 4. The pupil facet mirror 20 is arranged in a pupil plane of the illumination optical unit 4, which is optically conjugate with respect to the intermediate focal plane 18 and with respect to a pupil plane of the illumination optical unit 4 and to the projection optical unit 10 or coincides with the pupil plane. The pupil facet mirror 20 has a plurality of reflecting pupil facets which are not depicted in FIG. 1. The field facets of the field facet mirror 19 are imaged superposed on one another into the object field 5 with the aid of the pupil facets of the pupil facet mirror 20 and an imaging optical assembly, downstream thereof, in the form of a transfer optical unit 21 with mirrors denoted by 22, 23 and 24 in the order of the beam path. The last mirror 24 of the transfer optical unit 21 is a grazing incidence mirror.

In order to simplify the description of positional relationships, FIG. 1 plots a Cartesian xyz-coordinate system as a global coordinate system for the description of the positional relationships of components of the projection exposure apparatus 1 between the object plane 6 and the image plane 12. The x-axis extends perpendicularly to the plane of the drawing into the latter in FIG. 1. In FIG. 1, the y-axis extends to the right and parallel to the displacement direction of the object holder 8 and of the wafer holder 14. The z-axis extends downward in FIG. 1, i.e. perpendicular to the object plane 6 and to the image plane 12.

The x-dimension over the object field 5 or the image field 11 is also referred to as field height. The object displacement direction extends parallel to the y-axis.

Local Cartesian xyz-coordinate systems are plotted in the further figures. The x-axes of the local coordinate systems extend parallel to the x-axis of the global coordinate system according to FIG. 1. The xy-planes of the local coordinate systems represent arrangement planes of the components respectively presented in the figure. The y- and z-axes of the local coordinate systems are accordingly tilted about the respective x-axis through a certain angle.

Figure 2:
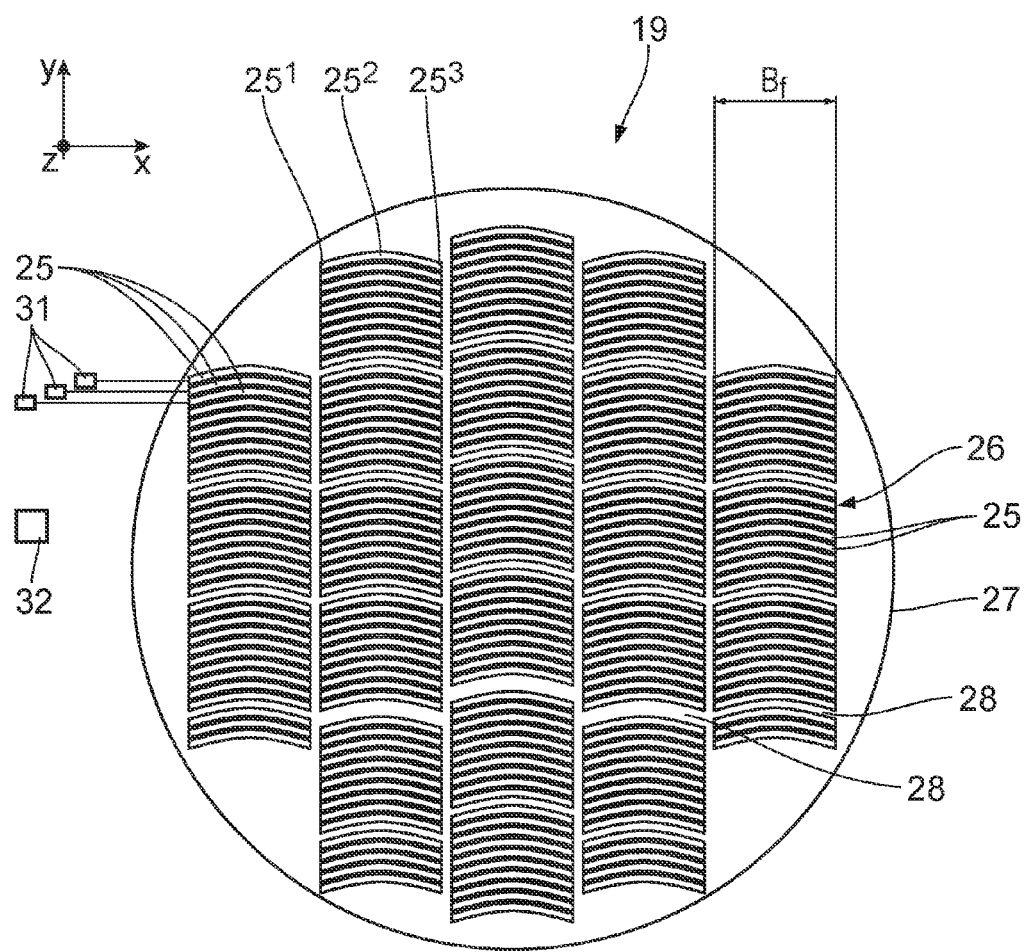
FIGS. 2 and 3 show arrangement variants of field facet mirrors which may be embodied with monolithic field facets but may also have field facets which are constructed from a plurality of individual mirrors in each case.
Figure 3:
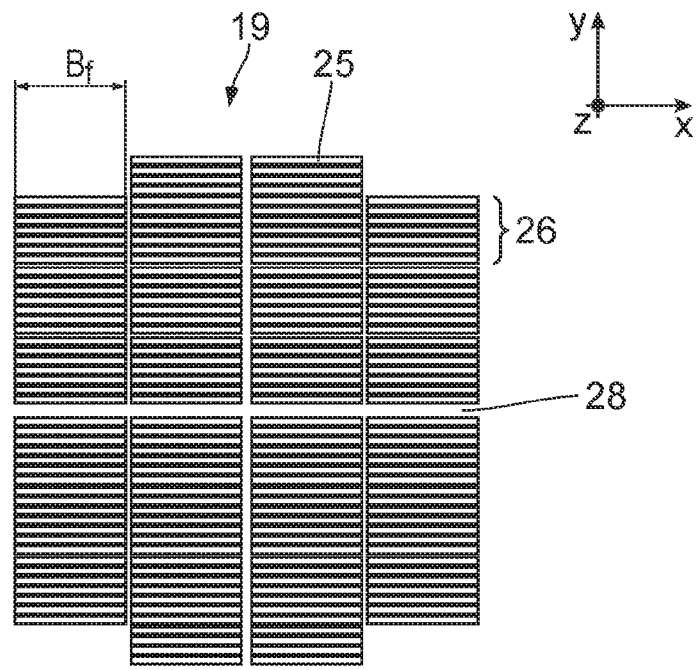

FIGS. 2 and 3 show examples of different facet arrangements for the field facet mirror 19. Each of the field facets 25 presented therein can be constructed as an individual mirror group from a plurality of individual mirrors, as is known from e.g. WO 2009/100 856 A1. Respectively one of the individual-mirror groups then has the function of a facet of a field facet mirror such as is disclosed for example in U.S. Pat. Nos. 6,438,199 B1 or 6,658,084 B2.

The field facet mirror 19 according to FIG. 2 includes a multiplicity of field facets 25 with an arcuate embodiment. These are arranged, in groups, in field facet blocks 26 on a field facet carrier 27. Overall, the field facet mirror 19 according to FIG. 2 includes twenty-six field facet blocks 26, in which three, five or ten of the field facets 25 are combined in groups.

Interstices 28 are present between the field facet blocks 26.

The field facet mirror 19 according to FIG. 3 includes rectangular field facets 25, which, once again, are arranged in groups to form field facet blocks 26, between which interstices 28 are present.

Figure 4:
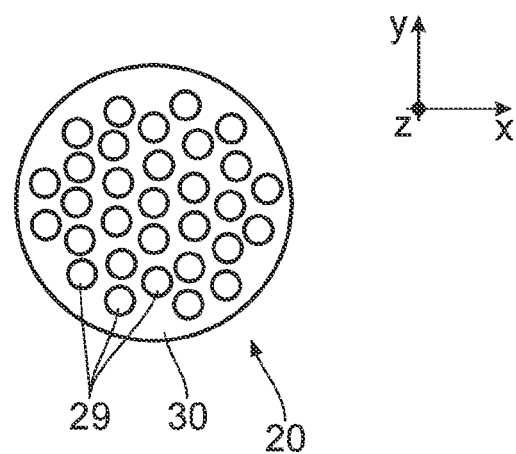
FIG. 4 schematically shows a plan view of a pupil facet mirror which, together with the field facet mirror, is part of an illumination optical unit of the projection exposure apparatus.

FIG. 4 schematically shows a plan view of the pupil facet mirror 20. Pupil facets 29 of the pupil facet mirror 20 are arranged in the region of an illumination pupil of the illumination optical unit 4. In reality, the number of pupil facets 29 is much greater than what is presented in FIG. 4. The pupil facets 29 are arranged on a pupil facet carrier of the pupil facet mirror 20. A distribution of pupil facets 29, which are impinged with the illumination light 16 via the field facets 25, within the illumination pupil prescribes an actual illumination angle distribution in the object field 5.

Each of the field facets 25 serves to transfer a part of the illumination light 16, i.e. an illumination light partial beam $16_i$, from the light source 2 toward one of the pupil facets 29.

Thus, the field facets 25 in each case are first facets of the illumination optical unit 4 in the beam path of the illumination light 16. Accordingly, the pupil facets 29 are second facets of the illumination optical unit 4 in the beam path of the illumination light 16.

Below, in a description of the illumination light partial beams $16_i$, the assumption is made that the associated field facet 25 is in each case illuminated to the maximum extent, i.e. over its entire reflection surface. In this case, an edge or marginal contour of the illumination light partial beam $16_i$ coincides with an edge or marginal contour of the illumination channel, which is why the illumination channels are also denoted by $16_i$ below. The respective illumination channel $16_i$ represents a possible light path of an illumination light partial beam $16_i$ that illuminates the associated field facet 25 to the maximum extent, via the further components of the illumination optical unit 4.

For each illumination channel $16_i$, the transfer optical unit 21 respectively includes one of the pupil facets 29 for transferring the illumination light partial beam $16_i$ from the field facet 25 toward the object field 5.

Respectively one illumination light partial beam $16_i$, of which two illumination light partial beams $16_i$ (i=1, . . . , N; N: number of field facets) are schematically presented in FIG. 1, is guided between the light source 2 and the object field 5 via exactly one of the field facets 25 and via exactly one of the pupil facets 29 via respectively one illumination channel.

At least some of the pupil facets 29, all of the pupil facets 29 of the pupil facet mirror 20 in the considered exemplary embodiment, are usable as correction pupil facets. These correction pupil facets are arranged in the beam path of the illumination light partial beam $16_i$ impinging thereon in such a way that an image 2' of the light source 2 arises at an image location which lies at a distance from the pupil facet 29 along the illumination channel $16_i$. In FIG. 1, a denotes a distance between the respective image 2' and the assigned pupil facet. Below, this distance a is also referred to as a defocusing distance.

FIG. 1 schematically presents two variants of such an arrangement of the light source images 2'. A first light source image $2'_1$ is arranged at an image location which is situated in the beam path of the associated illumination light partial beam $16_i$ before the reflection at the pupil facet 29 of the pupil facet mirror 20. In FIG. 1, $a_1$ denotes the distance between the light source image $2'_1$ and the associated pupil facet 29. A second light source image $2'_2$ is arranged in the beam path of a further illumination light partial beam $16_i$ at an image location after the reflection at the pupil facet of the pupil facet mirror 20. In FIG. 1, $a_2$ denotes the distance between the light source image $2'_2$ and the associated pupil facet 29.

Moreover, in FIG. 1, $B_{IF}$ denotes a typical size, namely the typical diameter, of a light source image IF, i.e. of an intermediate focus, in the intermediate focus plane 18. In FIG. 1, $B_{if}$ denotes a typical size of an image of the intermediate focus IF on the respective pupil facet 29. Additionally, $B_f$ denotes an x-extent of the respective field facet 25, i.e. a typical size of the field facet 25, in FIGS. 2 and 3.

At least some of the field facets 25, all field facets 25 in the presented exemplary embodiment, are usable as correction field facets, which are each assigned to a respective correction pupil facet 29 via one of the illumination channels $16_i$. The correction field facets 25 are connected to correction or displacement actuators in the form of tilt actuators 31, of which only a few displacement actuators 31 are presented schematically in FIG. 2. The displacement actuators 31 are embodied for the continuous displacement, namely for the continuous tilt, of the correction field facets 25. The displacement actuators 31 are embodied for tilting the correction field facets 25 about two mutually perpendicular axes, which extend parallel to the x-axis and to the y-axis, for example through a respective center or through a respective centroid of a reflection surface of the correction field facet 25.

The displacement actuators 31 are signal connected (cf. FIG. 1) via a signal connection not presented here to a correction control device 32 of the projection exposure apparatus 1. The correction control device 32 serves for the controlled tilt of the correction field facets 25.

The correction control device 32 and the displacement actuators 31 are embodied in such a way that a correction displacement travel—namely a correction tilt angle—of the correction field facets 25 in a correction displacement range—namely in a correction tilt angle range—is so large that a respective correction illumination channel $16_i$ is trimmed by an edge or margin of the associated correction pupil facet 29 in such a way that the illumination light partial beam $16_i$ is not transferred in the entirety thereof from the correction pupil facet 29 into the object field 5. This is explained in greater detail below with reference to FIG. 5 ff.

Figure 5:
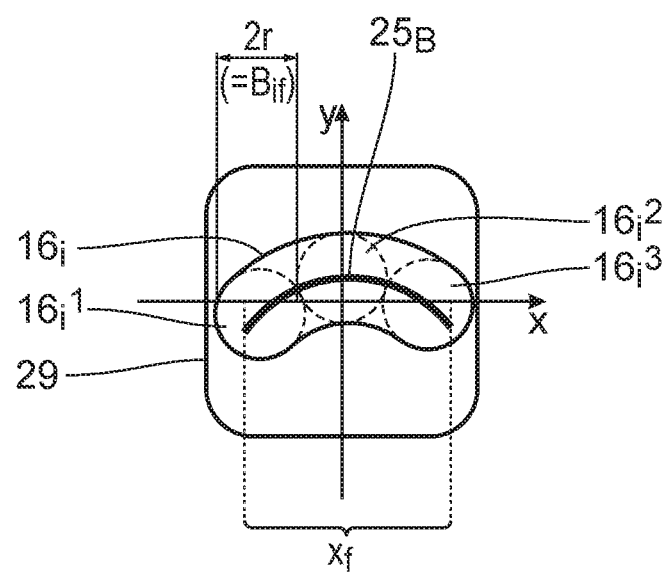
FIG. 5 shows a variant of a pupil facet which may be used in the pupil facet mirror according to FIG. 4, wherein an edge or marginal contour of an illumination light partial beam is presented on the pupil facet, the pupil facet being impinged via exactly one of the field facets and a prescribed illumination channel by way of the illumination light partial beam, wherein the illumination light partial beam impinges on the pupil facet in such a way that the illumination light partial beam is reflected in the entirety thereof by the pupil facet.

FIG. 5 shows one of the pupil facets 29 that can be used in the pupil facet mirror 20. The pupil facet 29 according to FIG. 5 does not have a circular edge or marginal contour, as presented in FIG. 4, but instead an almost square edge or marginal contour with rounded-off corners. Such an edge or marginal contour, which may also be designed without rounded-off corners, i.e. in a square or rectangular manner, allows the pupil facet carrier 30 to be occupied relatively densely with the pupil facets 29.

The pupil facet 29 according to FIG. 5 is impinged upon with the illumination light partial beam $16_i$ from an arcuate field facet 25 of the field facet mirror 19 according to FIG. 2.

FIG. 5 shows a location of the illumination light partial beam $16_i$ that is reflected by the pupil facet 29, in a tilt angle position of the field facet 25 that is assigned to this pupil facet 29 in which no illumination correction occurs. In this arrangement presented in FIG. 5, an entire cross section of the illumination light partial beam $16_i$ lies on the pupil facet 29, and so the edge or margin of the illumination light partial beam $16_i$ is not cut off or trimmed by the edge or margin of the pupil facet 29. An edge or marginal contour of the cross section of the illumination light partial beam $16_i$ on the pupil facet 29 has an approximately arcuate, bean-shaped or kidney-shaped form and can be understood to be the convolution of an image of the arcuate field facets 25 (cf. solid line "$25_B$" in FIG. 5) according to FIG. 2 with a round source area of the light source 2. This convolution arises on account of the fact that, as already explained above, the image 2' of the light source 2 arises at an image location which lies along the illumination channel $16_i$ at a distance from the pupil facet 29, i.e. upstream or downstream of the pupil facet 29 in the beam path.

The arcuate edge or marginal contour of the illumination light partial beam $16_i$ on the pupil facet 29 represents a light spot of the illumination light partial beam $16_i$.

Three sub-beams $16_i^1$, $16_i^2$ and $16_i^3$ are plotted using dashed lines in the edge or marginal contour of the illumination light partial beam $16_i$ on the pupil facet 29. The illumination light partial beam $16i$ is composed of a multiplicity of such sub-beams $16_i^j$. To the extent that the optical parameters of the illumination are known, the illumination light partial beam $16_i$ can be calculated, for example with the aid of an optical design program, and it is also referred to as "point spread function" in this context.

The illumination light 16 of these sub-beams $16_i^1$ to $16_i^3$ proceeds from a left edge or marginal point $25^1$, from a central point $25^2$ and from a right edge or marginal point $25^3$ of the associated field facet 25. In FIG. 2, these initial points $25^1$ to $25^3$ are plotted in an exemplary manner on one of the field facets 25.

In FIG. 5, r denotes the radius (half the diameter) of the sub-beams $16_i^j$. In FIG. 5, $x_f$ denotes the x-dimension of the field facet image $25_B$ on the pupil facet 29, i.e. the x-extent of a residual field component on the pupil facet 29.

By carrying out a correction tilt of the field facet 25, which impinges the pupil facet 29 according to FIG. 5, it is possible to achieve a field-dependent correction of an illumination angle distribution over the object field 5.

To render such a field-dependent correction possible, the following condition is satisfied for the defocus distance a:

$$a = k\, B_{if} f_f / B_f$$

Here, k characterizes the ratio between the sizes $x_f$ and r, i.e. between the typical extent $x_f$ of the residual field component $25_B$ and the radius r of the sub-beams $16_i^j$.

$B_{if}$ is the typical size of the image of the intermediate focus IF on the respective pupil facet 29. $f_f$ is the focal length of the associated field facet 25, i.e. the focal length with which the respective illumination light partial beam $16_i$ is imaged by the associated field facet 25. $B_f$ is the typical extent of the field facet 25.

Thus, the ratio $K = x_f/r$, i.e. the ratio of the size of the residual field component $x_f$ on the pupil facet 29 to the typical dimension r of the sub-beams $16_i^j$, inter alia, is decisive for the defocus value a. The following holds true: $2r = B_{if}$. So that the field-dependent correction is possible, the following additionally applies:

$$k \geq 0.5$$

In particular, $k \geq 1$ may apply, i.e. that residual field component $x_f$ has a typical size that is greater than the radius of the sub-beams $16_i^j$. The field dependence of the correction described above improves with increasing k. k may be greater than 1.5, may be greater than 2, may be greater than 3, may be greater than 4, may be greater than 5 and may also be even greater.

As soon as the typical diameter $B_{if}$ of the sub-beam $16_i^j$ is very much larger than the typical dimension $x_f$ of the field component, there is no usable field dependence via a correction tilt of the field facet 25, which impinges the pupil facet 29 according to FIG. 5. All that emerges then is a field-independent reduction in the intensity of the illumination light partial beam $16_i$.

Thus, as $B_{if}$ increases, the defocus distance a increases so that the field dependence for the correction is maintained during the correction tilt of the field facet 25.

Figure 6:
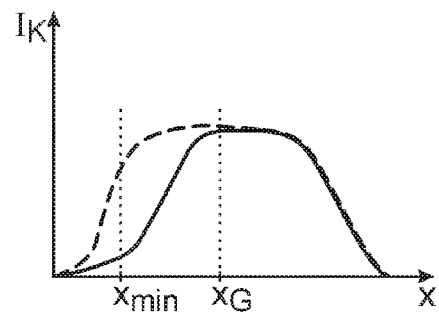
FIG. 6 shows, in a diagram, an intensity dependence of a channel intensity $I_K$ of an illumination light impingement of the object field on a field height x, i.e. on a dimension or coordinate perpendicular to an object displacement direction, wherein the intensity $I_K$, plotted for exactly one illumination channel, is plotted in a scan-integrated manner and wherein the effect of a displacement and a trim of the illumination light partial beam on the pupil facet in the −x-direction is presented.

FIG. 6 shows a dependence of a scan-integrated intensity $I_K$, which one of the illumination channels $16_i$ contributes for illuminating the object field 5, on the field height x. A scan integration means an integration of the illumination intensity along the y-coordinate of the object field 5.

A nominal field profile, which emerges if the entire illumination light partial beam $16_i$ is reflected from the pupil facet 29 toward the object field 5, is plotted using a dashed line.

The solid line in FIG. 6 represents a field profile of the channel intensity $I_K$ which arises when the illumination light partial beam $16_i$ is displaced on the pupil facet 29 by tilting the correction actuator 31 of the associated correction field facet 25 in the −x-direction such that the associated correction illumination channel $16_i$—and hence also the illumination light partial beam $16_i$—is cut off or trimmed by the edge or margin of the correction pupil facet 29. This edge, the left edge in FIGS. 5 and 6, of the illumination light partial beam $16_i$ now no longer contributes to illuminating the object field 5, and so the field profile plotted with a solid line in FIG. 6 emerges, in which the channel intensity $I_K$ in the case of small field height values x drops faster to a value of 0 than the dashed, nominal field profile. As a result, there is a field-dependent curve of an illumination over this pupil facet 29 via this illumination channel, i.e. a field-dependent curve of the intensity of the associated illumination angle. In the correction tilt position according to FIG. 6, an object field point at the x-value $x_{min}$ practically does not "see" illumination light 16 from the direction of the pupil facet 29 because illumination light 16, which emanates from an original image corresponding to this field height $x_{min}$ from the associated field facet of the illumination channel $16_i$ is not reflected by the pupil facet 29. Above a limit field height $x_G$, the correction field profile of the channel intensity $I_K$ merges back into the nominal field profile.

Figure 7:
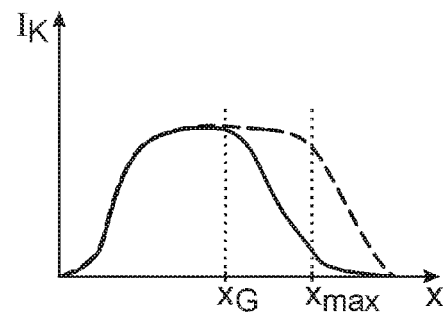
FIG. 7 shows, in an illustration similar to FIG. 6, the effect, on the field height dependence of the channel intensity $I_K(x)$, of a displacement of the illumination light partial beam on the pupil facet in the +x-direction.

FIG. 7 correspondingly shows a corrective effect when the tilt actuator 31 tilts the correction field facet 25 in such a way that the illumination light partial beam $16_i$ is displaced in the positive x-direction on the correction pupil facet 29 and cut off or trimmed by the edge or margin of the correction pupil facet 29. Presented once again by a solid line is the curve of the channel intensity $I_K$ over the field height x after the displacement has taken place, in comparison with the nominal field profile that is presented using a dashed line. Then, the object field points see practically no illumination light emerging from the associated correction pupil facet 29 in the region of a maximum field height $x_{max}$. Below a limit field height $x_G$, the correction field profile, which is depicted using a solid line, according to FIG. 7 merges back into the nominal field profile, which is depicted using a dashed line.

For the purposes of displacing the illumination light partial beam $16_i$ in the +/−x-direction, the associated correction field facet 25 is tilted by the associated tilt actuator about an axis that is parallel to the y-axis in FIG. 2.

Thus, an geometry of the arrangement of guiding the illumination light 16 via the illumination channels $16_i$ is such that a cross section of the illumination channel $16_i$ on the correction pupil facets 29 has such an edge or marginal contour that, by way of a size of the correction tilt angle, it is possible to set or prescribe marginal cutting off or trimming of the cross section in a direction +/−x perpendicular to the object displacement direction y.

Figure 8:
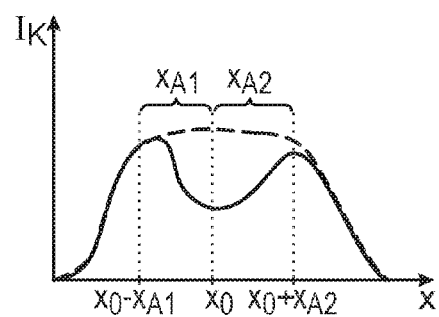
FIG. 8 shows, in an illustration similar to FIG. 6, the effect, on the field height dependence of the channel intensity $I_K(x)$, of a displacement of the illumination light partial beam on the pupil facet in the +y-direction.

FIG. 8 shows the result of a correction displacement of the illumination light partial beam $16_i$ on the correction pupil facet 29 according to FIG. 5 in the positive y-direction, caused by a corresponding correction tilt of the associated correction field facet 25 about an axis that is parallel to the x-axis. On account of the arcuate form of the illumination light partial beam $16_i$ on the correction pupil facet 29, the edge of the illumination light partial beam $16_i$ that is leading in the +y-direction is trimmed first in the region of the sub-beam $16_i^2$ by the edge or margin of the correction pupil facet 29 on account of this +y-displacement. This results in a reduction or a dip in the channel intensity $I_K$ in the region of a central field height $x_0$. Above a field height $x_0+x_{42}$ and below a field height $x_0-x_{41}$, the correction field profile of the channel intensity $I_K$, which is depicted in FIG. 8 using a solid line, merges back into the nominal field profile, which is depicted using a dashed line.

Figure 9:
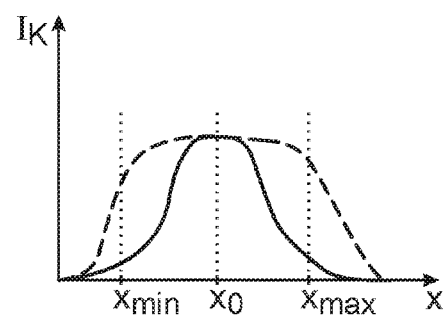
FIG. 9 shows, in an illustration similar to FIG. 6, the effect, on the field height dependence of the channel intensity $I_K(x)$, of a displacement of the illumination light partial beam on the pupil facet in the −y-direction.

FIG. 9 shows the effects of a correction by a displacement of the illumination light partial beam $16_i$ in accordance with FIG. 5 in the negative y-direction, caused by a tilt of the associated correction field facet 25 about an axis that is parallel to the x-axis. On account of the trimming of both ends of the arcuate form of the illumination light partial beam $16_i$ in the region of the sub-beams $16_i^1$ and $16_i^3$, this results in a drop in the channel intensity $I_K$ at both field height edges or margins, i.e. simultaneously in the region of the field height $x_{min}$ and $x_{max}$. In the region of the central field height $x_0$, the corrected field profile, which is depicted in FIG. 9 using the solid line, merges back into the nominal field profile of the channel intensity $I_K$, which is depicted using a dashed line.

Thus, an geometry of the arrangement of guiding the illumination light 16 via the illumination channels $16_i$ is such that a cross section of the illumination channel $16_i$ on the correction pupil facets 29 has such an edge or marginal contour that, by way of a size of the correction tilt angle, it is possible to prescribe marginal trimming or cutting off of the cross section in a direction +/−y along or parallel to the object displacement direction y.

Thus, by way of a direction +/−y of the correction tilt angle, it is possible to prescribe whether the cross section of the illumination channel $16_i$ is trimmed centrally (i.e. in the region $x_0$) or marginally (i.e. in the regions $x_{min}$ and $x_{max}$), as seen in a dimension x perpendicular to a trimmed or cut off edge or margin +/−y.

Trimming or cutting off the illumination light partial beam $16_i$ thus leads to illumination light 16 being transferred from this correction pupil facet 29 toward the object field 5 with different intensities, depending on the location on the object field 5. Thus, field-dependent correction of an illumination intensity distribution over the object field 5 can be obtained by a controlled tilting of the correction field facets 25.

A correspondingly trimmed illumination channel $16_i$ represents a correction illumination channel.

The correction displacements of the illumination light partial beam $16_i$ in the positive or negative x-direction can be combined with the correction displacements in the negative or positive y-direction. This can be effectuated by the simultaneous tilt of the correction field facets 25, which is assigned to the considered correction pupil facet 29, about the y-axis and about the x-axis through a corresponding correction tilt angle. The arising correction field profiles of the channel intensity $I_K$ emerge as superpositions of e.g. the correction field profiles according to FIGS. 6 and 8, according to FIGS. 6 and 9, according to FIGS. 7 and 8, or according to FIGS. 7 and 9. In this way, it is also possible to produce relatively complex correction field profiles.

A specific correction application of the illumination optical unit 4 described above is explained by way of example below on the basis of FIGS. 10 and 11.

Figure 10:
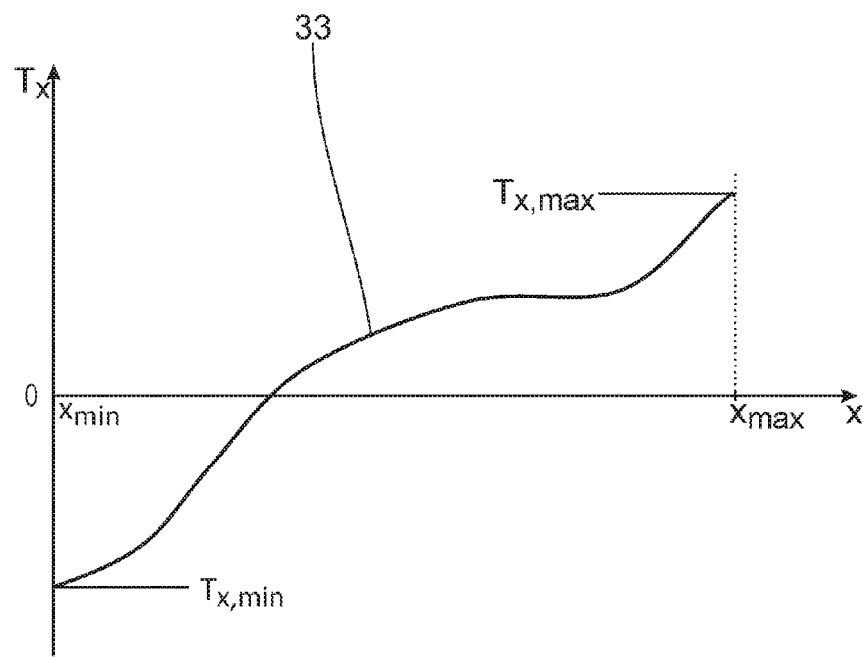
FIG. 10 schematically shows, in a diagram, a dependence of an x-telecentricity $T_x$ on the field height x prior to a correction by the targeted displacement of the illumination light partial beams on correction pupil facets in the style of the pupil facet according to FIG. 5 in the +x-direction (cf.

FIG. 10 shows a field profile, to be corrected, of an x-telecentricity $T_x$. The following holds true:

$$T_x(x) = K \cdot \frac{\sum_c I_c(x, \rho_x, \rho_y) \cdot \rho_x}{\sum_c I_c(x, \rho_x, \rho_y)},$$

where x describes the field point, K is a normalization factor and $I_C(x, \rho_x, \rho_y)$ denotes the intensity of the pupil of the c-th channel at the location $\rho_x$, $\rho_y$ at the field point x.

The telecentricity value $T_x$ rises monotonically over the field height x, from a minimum value $T_{x,min}$ at the field height $x_{min}$ to a value $T_{x,max}$ at the maximum field height $x_{max}$.

A curve of the x-telecentricity $T_x$ is depicted with a solid line at 33 in FIG. 10.

Figure 11:
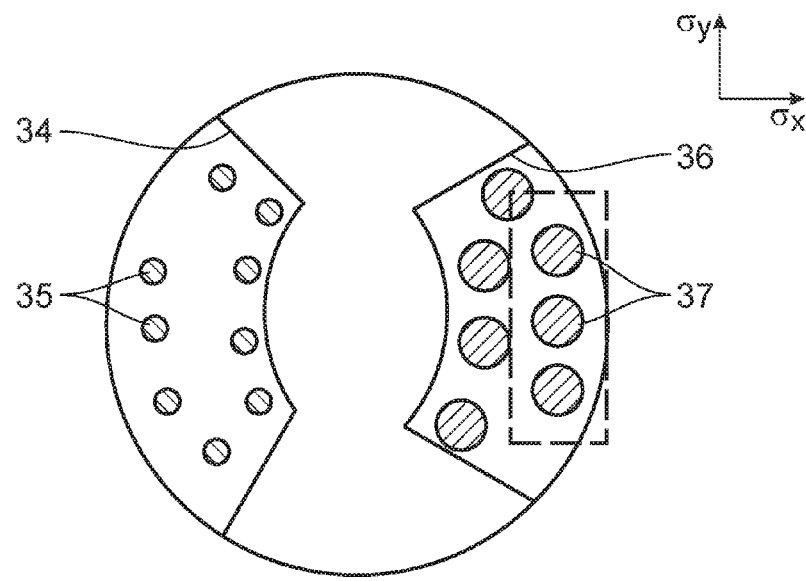
FIG. 11 schematically shows an intensity distribution over a pupil of the illumination optical unit for an object field point at the location $x=x_{max}$ prior to a correction of the x-telecentricity, with there being highlighting of pupil spots that are illuminated by pupil facets which are suitable as correction pupil facets, on which a +x-displacement according to FIG. 7 is caused.

FIG. 11 shows an illumination pupil of the illumination optical unit 4, which is seen by points of the object field 5 at the maximum field height $x_{max}$. An x-dipole setting is presented schematically and not true to scale. A left-hand pole 34 of this dipole illumination setting is formed by intensity contributions or pupil spots 35, which are produced by impinging this field height $x_{max}$ with corresponding pupil facets 29. The intensity contributions 35 are relatively weak, which is elucidated in FIG. 11 by the small radii of these intensity contributions 35.

A right-hand pole 36 of the dipole illumination setting according to FIG. 11 contains intensity contributions or pupil spots 37, proceeding from corresponding pupil facets 29 of the pupil facet mirror 20. The intensity contributions 37 are stronger than the intensity contributions 35, which is clarified in FIG. 11 by the correspondingly larger radii of these intensity contributions 37. On account of the stronger intensity contributions 37, the integrated illumination intensity over the pole 36 is greater than the integrated illumination intensity over the pole 34, leading to the positive x-telecentricity value $T_{x,max}$ at the location $x_{max}$.

Thus, the intensity contributions 37 that are highlighted in FIG. 11 by way of a dashed boundary can now be corrected by selecting the associated pupil facets 29 as correction pupil facets, i.e. they can now be reduced in respect of their intensities. In these associated pupil facets 29, there then is a displacement of the illumination light partial beams $16_i$ in the positive x-direction such that a field correction in accordance with FIG. 7 results. An integral intensity over the illumination pole 36, and hence the value $T_{x,max}$, can therefore be reduced.

FIG. 11 shows this scan-integrated illumination pupil of the field coordinate x, plotted over pupil coordinates σx, σy.

During the projection exposure with the aid of the projection exposure apparatus 1, a prescribed illumination setting is initially set and measured in respect of its illumination parameters. Subsequently, there is a selection of correction pupil facets and, by way of the controlled prescription of corresponding correction tilt angles of the assigned correction field facets, there is a correction of prescribed values of illumination parameters that cannot be maintained, until these lie within prescribed tolerance limits around prescribed intended values of the illumination parameters.

Furthermore, the illumination optical unit 4 includes a sensor unit 40 (cf. FIGS. 1 and 12) for capturing an intensity of the illumination light 16 depending on the field height x, i.e. depending on a transverse field coordinate x of the object field 5. The sensor unit 40 includes an upstream optical unit 41 and a sensor 42 that measures in a spatially resolved manner.

Figure 12:
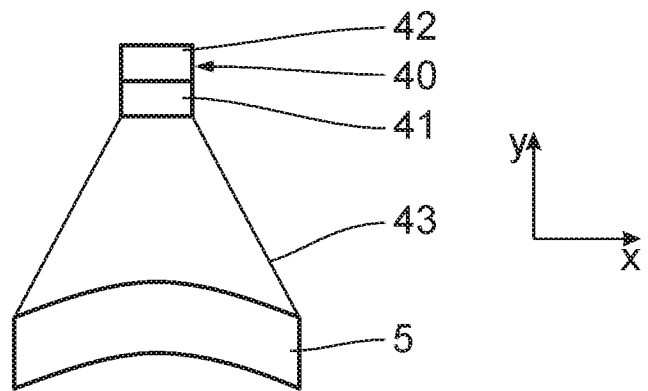
FIG. 12 schematically shows the object field and a sensor unit for capturing an intensity of the illumination light, depending on the field height x.

The upstream optical unit 41, which is schematically presented in FIG. 12, includes a capturing region 43 which covers the entire object field 5. The upstream optical unit 41 images the object field 5 on the sensor 42. The sensor 42 can be a line array or a line and column array made of individual illumination-light-sensitive sensor pixels. In particular, the sensor 42 is a CCD array. With the aid of appropriate wavelength conversion devices, for example with the aid of a scintillation coating, the EUV wavelength is converted in a detection wavelength, to which the sensor 42 is sensitive, for the purposes of measuring the illumination light intensity dependence on the field height x. Alternatively, it is possible to simulate the EUV light source 2 by a measurement light source for the purposes of measuring the dependence of the illumination light intensity on the field height x, the emission characteristic of the measurement light source corresponding to that of the EUV light source, but the measurement light source emitting a measurement wavelength for which the sensor 42 is sensitive.

Figure 13:
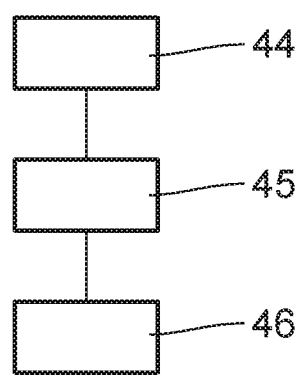
FIG. 13 shows, very schematically, a flowchart of a method for prescribing a minimum illumination intensity of the illumination light over the field height x, i.e. over a transverse field coordinate of the object field.

With the aid of the sensor unit 40, the central control device 32 and the tilt actuators 31, it is possible to carry out a method, described below, for prescribing a minimum illumination intensity $I_{min}$ (cf. FIGS. 14 and 15) over the field height x, which will still be described in more detail below, in particular on the basis of FIG. 13.

To this end, a minimum intensity transverse field coordinate $x_{min}$, at which an overall illumination intensity $I_{Ges,0}$ of the illumination light partial beams $16_i$ that are guided via all illumination channels $16_i$ is minimal, is initially identified in an identification step 44. This identification is carried out by measuring the overall illumination intensity $I_{Ges}$ over the field height x with the aid of the sensor unit 40 in the case of a first set of tilt positions of the tilt actuators 31 of the field facet mirror 19. An exemplary result of this measurement is presented in FIG. 14. The minimum intensity transverse field coordinate $x_{min}$ at the right field edge or margin of the object field 5 emerges. The associated intensity $I(x_{min})$ is $I_{min}$.

Subsequently, in an illumination channel identification step 45, at least one illumination channel $16_i$ is identified, in which a variation of a marginal trimming or cut off of the illumination light partial beam $16_i$, which is guided thereover, at the respective pupil facet 29 leads to an increase in an illumination intensity $I(x_{min})$ at the minimum intensity transverse field coordinate $x_{min}$. This illumination channel identification can be carried out by measuring the respective I(x) variation of the respective illumination channel $16_i$ when actuating the tilt actuator 31 of the field facet 25 that belongs to this illumination channel $16_i$, which, in principle, can be carried out for all illumination channels $16_i$ from a metro-logical point of view.

In so doing, it is possible to measure individual illumination channels $16_i$, with all other illumination channels $16_i$ then being shadowed.

Alternatively, a corresponding I(x) variation may also be effectuated by simulating the light guiding conditions of the respective illumination light partial beam $16_i$ over the illumination channel $16_i$.

For the illumination channels $16_i$, for which the illumination channel identification step 45 was successful, there subsequently is, in an alignment step 46, an alignment of the respective field facet 25 of the identified illumination channel $16_i$ for the purposes of increasing the illumination intensity of the associated illumination light partial beam $16_i$, at the minimum intensity transverse field coordinate $x_{min}$. Aligning is carried out by way of an appropriate actuation of the tilt actuator 31 of the at least one identified illumination channel 16$_i$.

Figure 14:
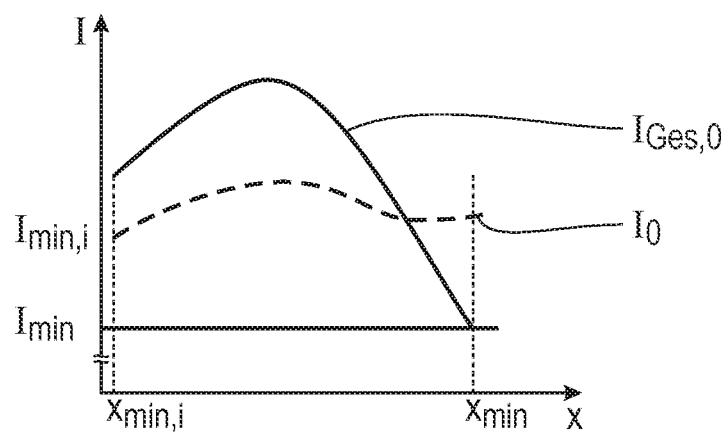
FIG. 14 shows, in a diagram, a dependence of an overall illumination intensity of all illumination light partial beams, guided via their respective illumination channels, depending on the field height before carrying out the prescription method according to FIG. 13.
Figure 15:
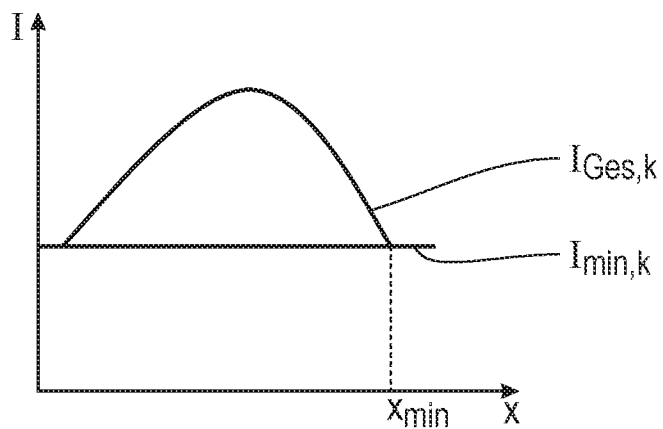
FIG. 15 shows, in an illustration similar to FIG. 14, the dependence of the overall illumination intensity on the field height after carrying out the prescription method according to FIG. 13.

The result of this prescription method with steps 44 to 46 is shown by FIG. 15 in an exemplary manner. As a result, the minimum illumination intensity $I_{min,k}$ is raised when compared with the initial minimum illumination intensity $I_{min}$ (cf. FIG. 14). $I_{min,k}$ can be greater than $I_{min}$ by 1 percent, 2 percent, 3 percent, 5 percent, 10 percent or a higher percentage.

On account of the new alignment of the field facets 25 in alignment step 46, a dependence of an illumination intensity $I_{Ges,k}$ of the entire illumination light 16 over the field height x has changed in comparison with the original intensity distribution $I_{Ges,0}$ such that, in the example of FIG. 15, the prescribed minimum illumination intensity $I_{min,k}$ now is present not only at the right field edge or margin, i.e. at the minimum intensity transverse field coordinate $x_{min}$, but also at the left field edge or margin.

In the method described above, the start is at the global intensity minimum over the field height x, which emerges from the superposition of the illumination intensities of all illumination light partial beams 16$_i$ over the field height x, i.e. over the transverse field coordinate.

In the prescription method, it is possible to identify exactly one illumination channel 16$_i$ or it is possible to identify a plurality of illumination channels 16$_i$. It is possible to identify all illumination channels 16$_i$ in which the desired illumination light intensity increase at the minimum intensity transverse field coordinate $x_{min}$ emerges by varying the marginal trimming or cutting off of the illumination light partial beam 16$_i$, guided thereover, at the pupil facet 29.

Additionally, it is also possible to carry out a further illumination channel identification step and a further facet alignment step during the prescription method explained above. These further identification and alignment steps can be carried out parallel to or sequentially with the identification and alignment steps explained above.

In the further illumination channel identification step, at least one illumination channel 16$_i$ is identified, in which a variation of a marginal trimming or cut off of the illumination light partial beam 16$_i$, which is guided thereover, at the pupil facet 29 leads to an increase in a minimum illumination intensity $I_{min,i}$ of this illumination light partial beam 16$_i$ over the transverse field coordinate, i.e. over the field height x. In FIG. 14 and using a dashed line, a dependence of an intensity curve $I_i$ of an illumination intensity of an illumination channel 16$_i$ identified thus is plotted in relative intensity units. This identification is once again carried out by way of a measurement with the aid of the sensor unit 40, within the scope of which all other illumination channels 16$_i$ are shadowed.

In the case of this intensity curve $I_i$ over the field height x, the illumination channel intensity $I_i$ is not minimal at the minimum intensity transverse field coordinate $x_{min}$, but at the other, left field edge or margin, i.e. at the coordinate $x_{min,i}$. The minimum intensity of this illumination channel 16$_i$ at the individual minimal coordinate $x_{min,i}$ is denoted by $I_{min,i}$ in FIG. 14. In reality, $I_{min,i}$ is naturally many orders of magnitude smaller than $I_{min}$. However, as already mentioned above, the curve $I_i$ is plotted in relative intensity units in FIG. 14 for elucidation purposes.

After this further illumination channel identification step, there is an alignment of the field facet 25 associated with this illumination channel 16$_i$ in the further facet alignment step for the purposes of increasing the minimum illumination intensity $I_{min,i}$ of this illumination channel 16$_i$ by virtue of the corresponding trimming variations being set at the associated pupil facet 29 of the illumination channel 16$_i$.

The alignment in the alignment steps is carried out by way of the tilt or correction actuators 31 in accordance with the exemplary embodiments described above. Thus, the field facets 25 can be tilted dynamically for alignment purposes. Alternatively, such an alignment can also already be effectuated statically in the basic design of the field facet mirror 19 such that field facets 25 that are tiltable via tilt actuators are not mandatory for carrying out the methods described above.

The result of the further illumination channel identification step and also of the further alignment step is an increase in the illumination intensity, not only in the region of the minimum intensity transverse field coordinate $x_{min}$ but also in the region of other field coordinates that may be important in respect of their possibly low illumination intensity; i.e., in the region of the left field coordinate $x_{min,i}$ that lies opposite to the minimum intensity transverse field coordinate $x_{min}$ in the example presented in FIGS. 14 and 15. Accordingly, carrying out the further illumination channel identification and facet alignment steps ensures that, when lifting the illumination intensity to the intensity $I_{min,k}$ at the minimum intensity transverse field coordinate $x_{min}$ with the aid of steps 44 to 46 explained above, the illumination intensity is not undesirably lower than $I_{min,k}$ at another field coordinate.

During the projection exposure with the aid of the projection exposure apparatus 1, an illumination geometry is initially set with the aid of the setting method explained above. Then, at least one part of the reticle 7 in the object field 5 is imaged onto a region of the light-sensitive layer onto the wafer 13 in the image field 11 for the lithographic production of a microstructured or nanostructured component, in particular of a semiconductor component, for example of a microchip. In this case, the reticle 7 and the wafer 13 are moved in a temporally synchronized manner in the y-direction continuously in scanner operation.

What is claimed is:

1. An illumination optical unit configured to illuminate an object field in which an object to be imaged is arrangeable, the illumination optical unit comprising:
   a field facet mirror comprising a plurality of field facets arranged in a region of a field plane of the illumination optical unit;
   a pupil facet mirror comprising a plurality of pupil facets in a region of a pupil plane of the illumination optical unit;
   a correction control device; and
   correction actuators,
   wherein:
     each of the field facets is configured to transfer used illumination light from a light source to respectively one of the pupil facets;
     the illumination optical unit is configured so that, during use of the illumination optical unit via respectively one illumination channel, a respective used illumination light partial beam is guided between the light source and the object field via exactly one field facet and exactly one pupil facet;
     a transfer optical unit is downstream of the field facet in the respective illumination channel;
     the transfer optical unit is configured to superimposedly image the field facets into the object field;
     for each illumination channel, the transfer optical unit respectively includes one of the pupil facets to transfer the illumination light partial beam from the field facet toward the object field;

at least some pupil facets, which are usable as correction pupil facets, are arranged in the beam path of the illumination light partial beam impinging thereon so that an image of the light source arises at an image location which lies at a distance from the pupil facet along the illumination channel;

the correction control device is configured to controlledly displace at least some of the field facets, which are assigned to the correction pupil facets via the respective illumination channels and which are usable as correction field facets, via the correction actuators which are connected to the correction field facets;

the correction control device and the correction actuators are configured so that a correction displacement travel of the correction field facets in a correction displacement range is so large that a respective correction illumination channel is cut off by an edge of the correction pupil facet so that the illumination light partial beam is not transferred in the entirety thereof from the correction pupil facet into the object field; and the illumination optical unit an EUV lithography illumination optical unit.

2. The illumination optical unit of claim 1, wherein the correction actuators are configured to continuously displace the correction field facets.

3. The illumination optical unit of claim 2, wherein the correction actuators are configured to displace the correction field facets about two mutually perpendicular axes.

4. The illumination optical unit of claim 2, wherein:
the object is displaceable along an object displacement direction; and
an arrangement geometry of guiding the illumination light via the illumination channels is such that a cross section of the respective illumination channel on the correction pupil facets has a marginal contour so that, over a variable of the correction displacement path, the cross section in a direction perpendicular to the object displacement direction is marginal trimmed or cut off during use of the illumination optical unit.

5. The illumination optical unit of claim 2, wherein:
the object is displaceable along an object displacement direction; and
an arrangement geometry of guiding the illumination light via the illumination channels is such that a cross section of the respective illumination channel on the correction pupil facets has a marginal contour so that, over a variable of the correction displacement path, the cross section in a direction parallel to the object displacement direction is marginal trimmed or cut off during use of the illumination optical unit.

6. The illumination optical unit of claim 2, wherein the illumination optical unit is configured to determining, by way of a direction of the correction displacement path, whether trimming of the cross section of the illumination channel is carried out centrally or marginally when seen in a dimension perpendicular to a trimmed or cut off edge or margin.

7. The illumination optical unit of claim 2, wherein the field facets comprise arcuate field facets.

8. The illumination optical unit of claim 1, wherein the correction actuators are configured to displace the correction field facets about two mutually perpendicular axes.

9. The illumination optical unit of claim 1, wherein:
the object is displaceable along an object displacement direction; and
an arrangement geometry of guiding the illumination light via the illumination channels is such that a cross section of the respective illumination channel on the correction pupil facets has a marginal contour so that, over a variable of the correction displacement path, the cross section in a direction perpendicular to the object displacement direction is marginal trimmed or cut off during use of the illumination optical unit.

10. The illumination optical unit of claim 1, wherein:
the object is displaceable along an object displacement direction; and
an arrangement geometry of guiding the illumination light via the illumination channels is such that a cross section of the respective illumination channel on the correction pupil facets has a marginal contour so that, over a variable of the correction displacement path, the cross section in a direction parallel to the object displacement direction is marginal trimmed or cut off during use of the illumination optical unit.

11. The illumination optical unit of claim 1, wherein the illumination optical unit is configured to determining, by way of a direction of the correction displacement path, whether trimming of the cross section of the illumination channel is carried out centrally or marginally when seen in a dimension perpendicular to a trimmed or cut off edge or margin.

12. The illumination optical unit of claim 1, wherein the field facets comprise arcuate field facets.

13. An illumination system, comprising:
an illumination optical unit according to claim 1; and
a light source configured to produce the illumination light.

14. An optical system, comprising:
an illumination optical unit, comprising:
an illumination optical unit according to claim 1; and
a light source configured to produce the illumination light; and
a projection optical unit configured to image the object field into an image field.

15. An optical system, comprising:
an illumination optical unit, comprising:
an illumination optical unit according to claim 2; and
a light source configured to produce the illumination light; and
a projection optical unit configured to image the object field into an image field.

16. An apparatus, comprising:
an illumination optical system, comprising:
an illumination optical unit according to claim 1; and
a light source configured to produce the illumination light;
a projection optical unit configured to image the object field into an image field;
an object holder comprising an object displacement drive configured to displace the object along an object displacement direction; and
a wafer holder comprising a wafer displacement drive configured to displace a wafer in a manner synchronized with the object displacement drive,
wherein the apparatus is a projection exposure apparatus.

17. A method of using a projection exposure apparatus comprising an illumination optical unit and a projection optical unit, the method comprising:
using the illumination optical unit to illuminate at least a portion of an object in an object field; and
using the projection optical unit to project at least a portion of the illuminated object into an image field, wherein the illumination optical unit is an illumination optical unit according to claim 1.

18. A method for prescribing an intended distribution of an illumination light intensity over a field height of an object field of a projection exposure apparatus including an illumination optical unit for illuminating the object field, in which an object to be imaged that is displaceable transversely to the field height in an object displacement direction is arrangeable, a field facet mirror comprising a plurality of field facets being arranged in a region of a field plane of the illumination optical unit, a pupil facet mirror comprising a plurality of pupil facets arranged in a region of a pupil plane of the illumination optical unit, each of the field facets configured to transfer used illumination light from a light source to respectively one of the pupil facets, via respectively one illumination channel, a respective used illumination light partial beam being guided between the light source and the object field via exactly one field facet and exactly one pupil facet, a transfer optical unit downstream of the field facet in the respective illumination channel and configured to superposedly image the field facets into the object field, for each illumination channel the transfer optical unit respectively comprising one of the pupil facets for transferring the illumination light partial beam from the field facet toward the object field, the method comprising:

using at least some pupil facets as correction pupil facets, which are arranged in the beam path of the illumination light partial beam impinging thereon in such a way that an image of the light source arises at an image location which lies at a distance from the pupil facet along the illumination channel;

displacing, in a controlled manner, at least some of the field facets as correction field facets, which are assigned to the correction pupil facets via the respective illumination channels, with a correction control device via correction actuators that are connected to the correction field facets; and selecting a correction displacement travel of the correction field facets within a correction displacement range in such a way that a respective correction illumination channel is cut off by an edge of the correction pupil facet so that the illumination light partial beam is not transferred in the entirety thereof from the correction pupil facet into the object field.

19. A method for prescribing a minimum illumination intensity of illumination light over a transverse field coordinate of an object field of an illumination optical unit for projection lithography, an object to be imaged being arrangeable in the object field, the transverse field coordinate extending transversely to an object displacement direction along which the object is displaceable, the illumination optical unit comprising two facet mirrors arranged in succession in the beam path of the illumination light so that, via respectively one illumination channel, a respective used illumination light partial beam is guided between a light source and the object field via exactly one facet of the first facet mirror and exactly one facet of the second facet mirror, the method comprising:

identifying a minimum intensity transverse field coordinate at which the overall illumination intensity of the illumination light partial beams that are guided via all illumination channels is minimal;

identifying at least one illumination channel in which a variation of a marginal trimming or cut off of the illumination light partial beam, which is guided thereover, at the second facet leads to an increase in an illumination intensity of this illumination light partial beam at the minimum intensity transverse field coordinate; and aligning the first facet of this illumination channel for increasing the illumination intensity thereof at the minimum intensity transverse field coordinate.

20. The method of 19, further comprising:

identifying at least one illumination channel, in which a variation of a marginal trimming or cut off of the illumination light partial beam, which is guided thereover, at the second facet leads to an increase in a minimum illumination intensity of this illumination light partial beam over the transverse field coordinate; and aligning the first facet of this illumination channel for increasing this minimum illumination intensity.

* * * * *

UNITED STATES PATENT AND TRADEMARK OFFICE
CERTIFICATE OF CORRECTION

PATENT NO. : 9,939,731 B2
APPLICATION NO. : 15/672906
DATED : April 10, 2018
INVENTOR(S) : Alexander Winkler et al.

Page 1 of 1

It is certified that error appears in the above-identified patent and that said Letters Patent is hereby corrected as shown below:

In the Specification

Column 5, Line 50, delete "inllumination" and insert -- illumination --;

Column 6, Line 10, delete "identifeed" and insert -- identified --;

In the Claims

Column 18, Line 63 Claim 1, delete "superimposedly" and insert -- superposedly --;

Column 22, Line 32 Claim 20, after "of" insert -- claim --.

Signed and Sealed this
Twenty-eighth Day of August, 2018

Andrei Iancu
*Director of the United States Patent and Trademark Office*